(12) United States Patent
Shu et al.

(10) Patent No.: US 10,418,272 B1
(45) Date of Patent: Sep. 17, 2019

(54) METHODS, APPARATUS, AND SYSTEM FOR A SEMICONDUCTOR DEVICE COMPRISING GATES WITH SHORT HEIGHTS

(71) Applicant: GLOBALFOUNDRIES INC., Grand Cayman (KY)

(72) Inventors: Jiehui Shu, Clifton Park, NY (US); Garo Jacques Derderian, Saratoga Springs, NY (US); Hui Zang, Guilderland, NY (US); John Zhang, Altamont, NY (US); Haigou Huang, Rexford, NY (US); Jinping Liu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/976,326

(22) Filed: May 10, 2018

(51) Int. Cl.
| | |
|---|---|
| *H01L 21/02* | (2006.01) |
| *H01L 21/762* | (2006.01) |
| *H01L 21/8238* | (2006.01) |
| *H01L 21/8234* | (2006.01) |
| *H01L 27/088* | (2006.01) |
| *H01L 29/66* | (2006.01) |
| *H01L 29/78* | (2006.01) |
| *H01L 27/092* | (2006.01) |

(52) U.S. Cl.
CPC .... *H01L 21/76224* (2013.01); *H01L 21/0228* (2013.01); *H01L 21/02167* (2013.01); *H01L 21/02282* (2013.01); *H01L 21/823431* (2013.01); *H01L 21/823821* (2013.01); *H01L 27/0886* (2013.01); *H01L 27/0924* (2013.01); *H01L 29/66795* (2013.01); *H01L 29/785* (2013.01)

(58) Field of Classification Search
CPC ... H01L 21/76; H01L 21/76224; H01L 21/02; H01L 21/02167; H01L 21/285; H01L 21/0228; H01L 21/02282; H01L 21/823431; H01L 21/823821; H01L 21/8238; H01L 21/28518; H01L 21/823814; H01L 21/823871
USPC .......................................... 257/288; 438/197
See application file for complete search history.

(56) References Cited

U.S. PATENT DOCUMENTS

| | | | |
|---|---|---|---|
| 8,048,790 B2 | 11/2011 | Soss et al. | |
| 8,647,952 B2 | 2/2014 | Baars et al. | |
| 8,741,723 B2 | 6/2014 | Chi | |
| 8,772,168 B2 | 7/2014 | Xie et al. | |
| 8,946,803 B2 * | 2/2015 | Matamis | H01L 21/28273 257/315 |
| 9,257,529 B2 | 2/2016 | Metz | |
| 2013/0187203 A1 | 7/2013 | Xie et al. | |
| 2015/0263160 A1 * | 9/2015 | Xie | H01L 29/6653 257/329 |
| 2016/0372332 A1 * | 12/2016 | Pranatharthiharan | H01L 23/5226 |

* cited by examiner

*Primary Examiner* — Chuong A Luu
(74) *Attorney, Agent, or Firm* — Williams Morgan, P.C.

(57) ABSTRACT

At least one method, apparatus and system providing semiconductor devices with relatively short gate heights but without a relatively high risk of contact-to-gate shorts. In embodiments, the method, apparatus, and system may provide contact formation by way of self-aligned contact processes.

14 Claims, 14 Drawing Sheets

METHODS, APPARATUS, AND SYSTEM FOR A SEMICONDUCTOR DEVICE COMPRISING GATES WITH SHORT HEIGHTS

BACKGROUND OF THE INVENTION

Field of the Invention

Generally, the present disclosure relates to the manufacture of sophisticated semiconductor devices, and more specifically, to semiconductor devices having short gate heights.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region.

In contrast to a planar FET, which has a planar structure, there are so-called 3D devices, such as an illustrative finFET device, which is a 3-dimensional structure. More specifically, in a finFET, a generally vertically positioned, fin-shaped active area is formed and a gate electrode encloses both of the sides and the upper surface of the fin-shaped active area to form a trigate structure so as to use a channel having a 3-dimensional structure instead of a planar structure. In some cases, an insulating cap layer, e.g., silicon nitride, is positioned at the top of the fin and the finFET device only has a dual-gate structure.

Using one of various techniques, a plurality of fins is formed on a substrate and a gate, a source, and a drain are formed above the fins. The gate is formed between the source and drain regions.

In the continuing effort to increase transistor density in semiconductor devices, designers have attempted to reduce the widths of the fins, gate, sources, and drains. However, finding optimal gate heights has proven challenging. As gate widths are reduced, the likelihood of physical collapse of a gate increases. Hence, in the interest of reducing the likelihood of gate collapse, some designers have considered short gates. However, the shorter a gate, the greater the risk that processing errors may allow short circuiting between the gates and contacts to the gates, sources, and/or drains.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for providing relatively short gate heights without a relatively high risk of contact-to-gate shorts and/or providing contact formation by way of self-aligned contact processes.

In one embodiment, the present disclosure relates to a method comprising forming a gate over at least one fin disposed on a semiconductor substrate; forming a first spacer disposed on one gate sidewall and a second spacer disposed on another gate sidewall; forming a dielectric material adjacent the first spacer and adjacent the second spacer; recessing the gate to below a top of the first spacer and a top of the second spacer; forming a silicon nitride liner on a top of the recessed gate; growing a silicon nitride cap selectively on the silicon nitride liner and at least on a top of the first spacer and a top of the second spacer; and forming contacts to the gate and the fin, wherein contact formation is self-aligned by the silicon nitride cap.

In one embodiment, the present disclosure relates to a semiconductor device, comprising a semiconductor substrate; a fin disposed on the semiconductor substrate; a shallow trench isolation (STI) disposed in the silicon substrate adjacent to the fin; a gate disposed over the fin and the STI; a first spacer disposed on one gate sidewall and a second spacer disposed on another gate sidewall, wherein a top of the gate is below a top of the first spacer and a top of the second spacer; and a silicon nitride cap disposed on the gate, on the top of the first spacer, and on the top of the second spacer.

In one embodiment, the present disclosure relates to a system comprising a semiconductor device processing system to manufacture a semiconductor device comprising at least one fin field effect transistor (finFET); and a processing controller operatively coupled to the semiconductor device processing system, the processing controller configured to control an operation of the semiconductor device processing system; wherein the semiconductor device processing system is adapted to implement a method referred to above.

BRIEF DESCRIPTION OF THE DRAWINGS

The disclosure may be understood by reference to the following description taken in conjunction with the accompanying drawings, in which like reference numerals identify like elements, and in which.

Figure 1:
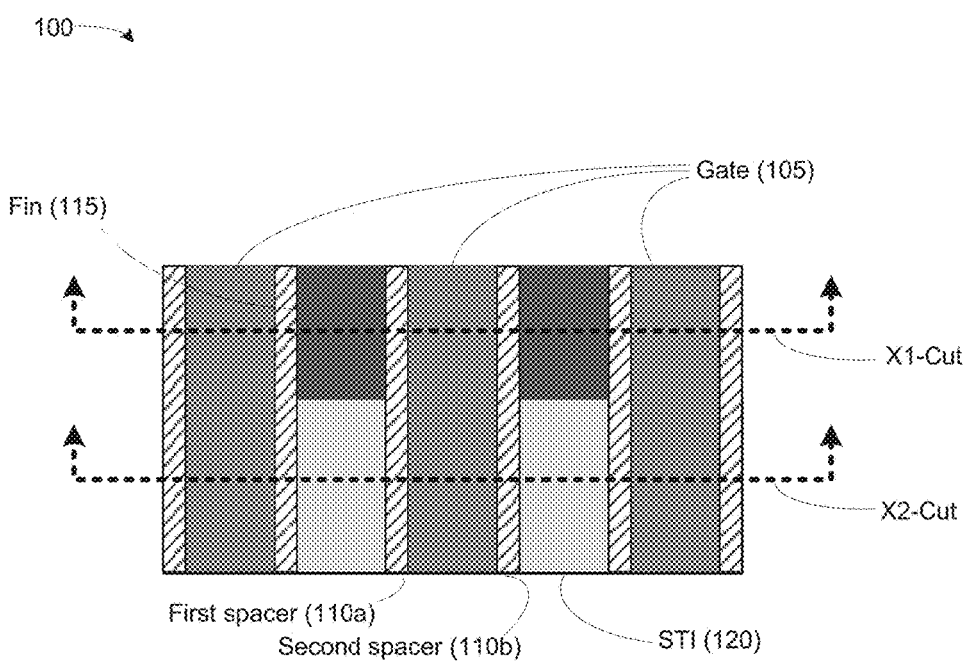
FIG. 1 illustrates a stylized, simplified plan view of a semiconductor device 100, with an X1-cut line and an X2-cut line indicated, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached Figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for relatively short gates while limiting or eliminating increased risks of short circuiting between contact features and gate features. Embodiments herein provide for semiconductor devices comprising silicon nitride caps over gates. Such devices may provide the advantages of a relatively short gate height with reduced risk of contact-to-gate shorts. Alternatively or in addition, such devices may allow contacts to be formed by way of a self-aligned contact process.

Turning now to FIG. 1, a stylized, simplified top or plan view of a semiconductor device 100 is illustrated. The semiconductor device 100 comprises at least one active area, e.g., fin 115 and at least one shallow trench isolation (STI) 120. The fin 115 and the STI 120 are generally rectangular in top view, and the long axis of the fin 115 and the long axis of the STI 120 are generally parallel.

For ease of illustration, only one fin 115 and one STI 120 are depicted in FIG. 1, however, the person of ordinary skill in the art will appreciate that the semiconductor device 100 may comprise a plurality of fins 115 and a plurality of STIs 120. Generally, in embodiments with more than one fin 115 and more than one STI 120, one STI 120 is disposed between two fins 115, and one fin 115 is disposed between two STIs 120.

The semiconductor device 100 also comprises at least one gate 105. The gate 105 is disposed over the fin 115 and the STI 120. The gate 105 is generally rectangular in top view, and the long axis of the gate 105 is generally perpendicular to the long axes of the fin 115 and the gate 120. As depicted, the semiconductor device 100 of FIG. 1 shows three gates 105; however, the person of ordinary skill in the art will understand that the semiconductor device 100 may comprise one, two, three, four, or more gates 105.

The semiconductor device 100 also comprises a first spacer 110a and a second spacer 110b. The spacers 110a and 110b may be referred to collectively as spacers 110. Each spacer 110 is disposed on one side of a gate 105.

The gate 105, the spacers 110, the fin 115, and the STI 120 may be formed of components and materials, and may be formed by processes, known to the person of ordinary skill in the art and which need not be described further.

FIG. 1 illustrates a semiconductor device 100 in a nearsighted view in which one or more structures overlying one or more of the gate 105, the spacers 110, the fin 115, and/or the STI 120 in an intermediate semiconductor device 100 or a finished semiconductor device 100 are omitted for clarity and brevity.

FIG. 1 also shows an X1-cut line and an X2-cut line provided for reference with respect to a cross-sectional view shown in subsequent figures. The X1-cut transects the gate 105, the spacers 110, and the fin 115 along the long axis of the fin 115. The X2-cut transects the gate 105, the spacers 110, and the STI 120 along the long axis of the STI 120. FIGS. 2-23 represent stylized cross-sectional views of finFET devices with respect to the X1-cut line or the X2-cut line, in accordance with exemplary embodiments herein.

Although embodiments depicted in FIGS. 1-23 show a FinFET device, the methods for constructing devices with short gate heights may be applied to the formation of other devices, such as fully-depleted silicon on insulator (FDSOI) and planar FET devices. Such non-FinFET devices produced by methods disclosed herein are also encompassed by the present disclosure.

Figure 2:
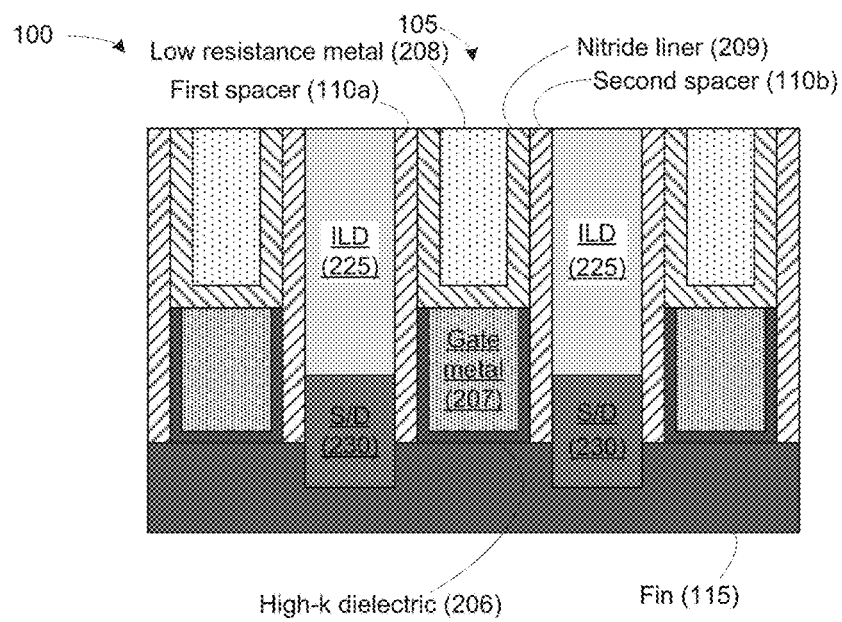
FIG. 2 illustrates a stylized depiction of an X1-cut cross-sectional view of the semiconductor device 100 of FIG. 1 after a gate formation process, in accordance with embodiments herein.
Figure 3:
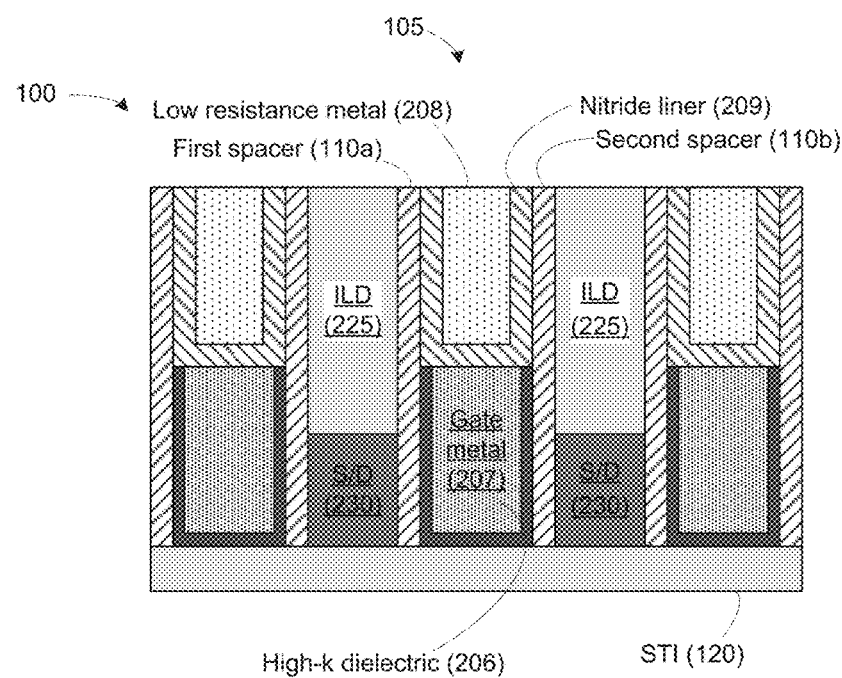
FIG. 3 illustrates a stylized depiction of an X2-cut cross-sectional view of the semiconductor device 100 of FIG. 1 after the gate formation process, in accordance with embodiments herein.

Turning to FIGS. 2-3, FIG. 2 illustrates a stylized depiction of an X1-cut cross-sectional view and FIG. 3 illustrates a stylized depiction of an X2-cut cross-sectional view of the semiconductor device 100 of FIG. 1 after a gate formation process, in accordance with embodiments herein. The gate formation process yields various components of the gate 105, including a high-k dielectric 206 on the bottom and lower portions of the sides of the gate 105; a gate metal 207; a nitride liner (e.g., titanium nitride) 209 on the gate metal 207 and upper portions of the sides of the gate 105; and a low resistance metal (e.g., tungsten) 208.

The semiconductor device 100 at this stage also comprises source/drains 230 disposed adjacent to the spacers 110. The sources/drains 230 have long axes running into and out of the view, generally parallel to the long axis of the gate 105. Surmounting the sources/drains 230 is an interlayer dielectric (ILD) 225. The ILD may be formed of silicon oxide, among other materials.

The gate 105 and sources/drains 230 are disposed over the fin 115 (as shown in FIG. 2) and the STI 120 (as shown in FIG. 3).

Figure 4:
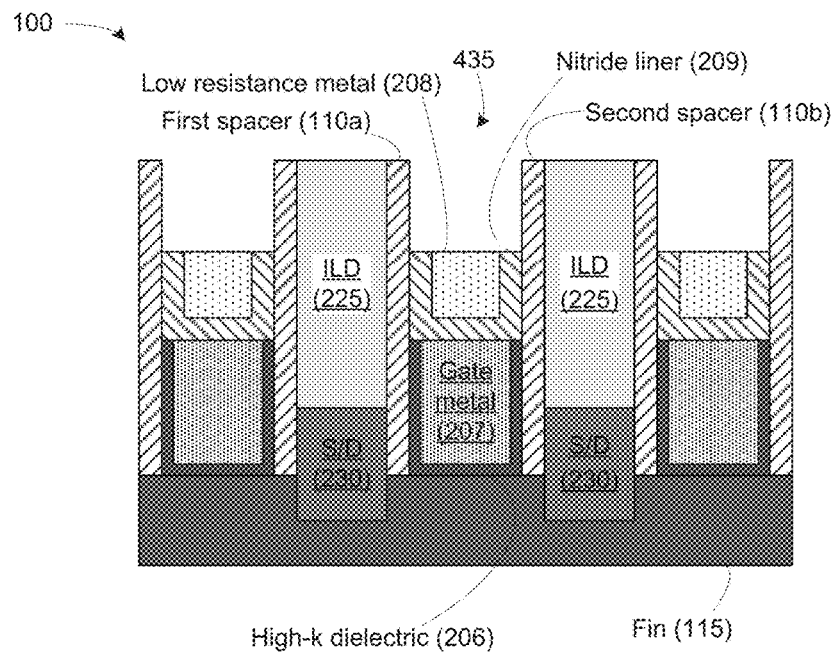
FIG. 4 illustrates a stylized depiction of an X1-cut cross-sectional view of the semiconductor device 100 of FIGS. 2-3 after a gate recess process, in accordance with embodiments herein.
Figure 5:
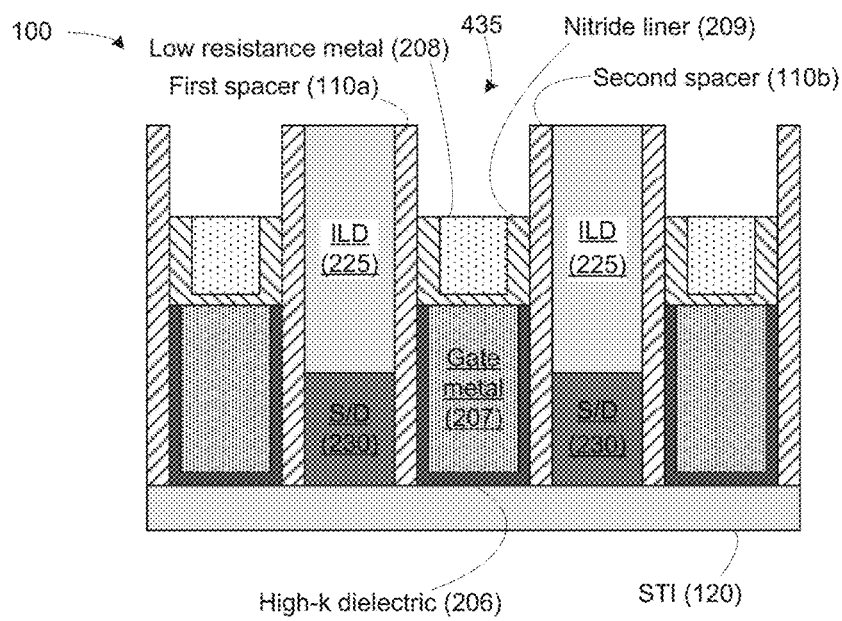
FIG. 5 illustrates a stylized depiction of an X2-cut cross-sectional view of the semiconductor device 100 of FIGS. 2-3 after the gate recess process, in accordance with embodiments herein.

FIG. 4 illustrates a stylized depiction of an X1-cut cross-sectional view and FIG. 5 illustrates a stylized depiction of an X2-cut cross-sectional view of the semiconductor device 100 of FIGS. 2-3 after a gate recess process, in accordance with embodiments herein. In the gate recess process, the low resistance metal 208 and the nitride liner 209 are partially removed from the upper portion of the gate 105, to yield a recess 435. The bottom of the recess 435 is below the tops of the first spacer 110a and the second spacer 110b. The low resistance metal 208 and the nitride liner 209 may be partially removed by any appropriate technique to which the spacers 110 and the ILD 225 are resistant. The low resistance metal 208 and the nitride liner 209 may be partially removed in either order.

Figure 6:
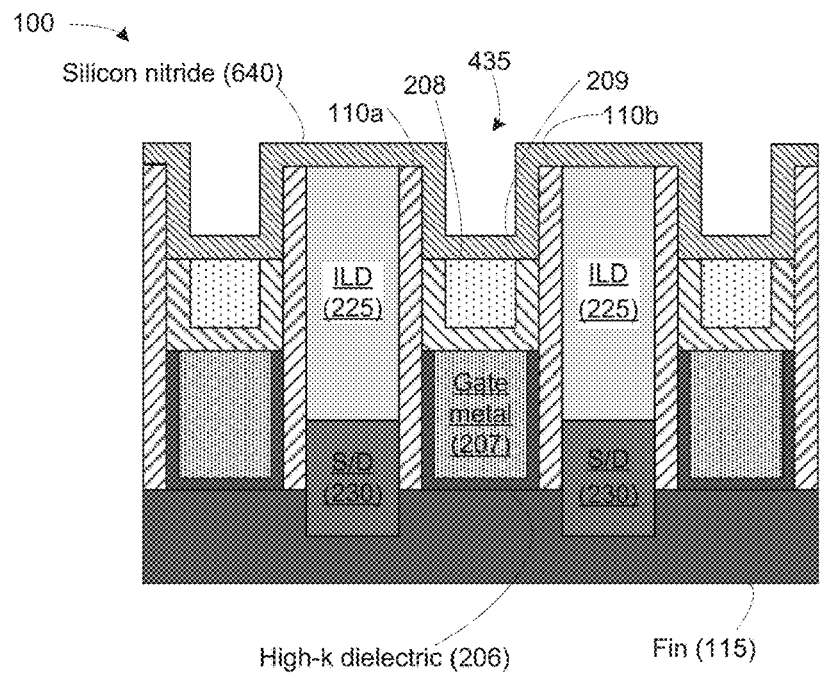
FIG. 6 illustrates a stylized depiction of an X1-cut cross-sectional view of the semiconductor device 100 of FIGS. 4-5 after a silicon nitride deposition process, in accordance with embodiments herein.
Figure 7:
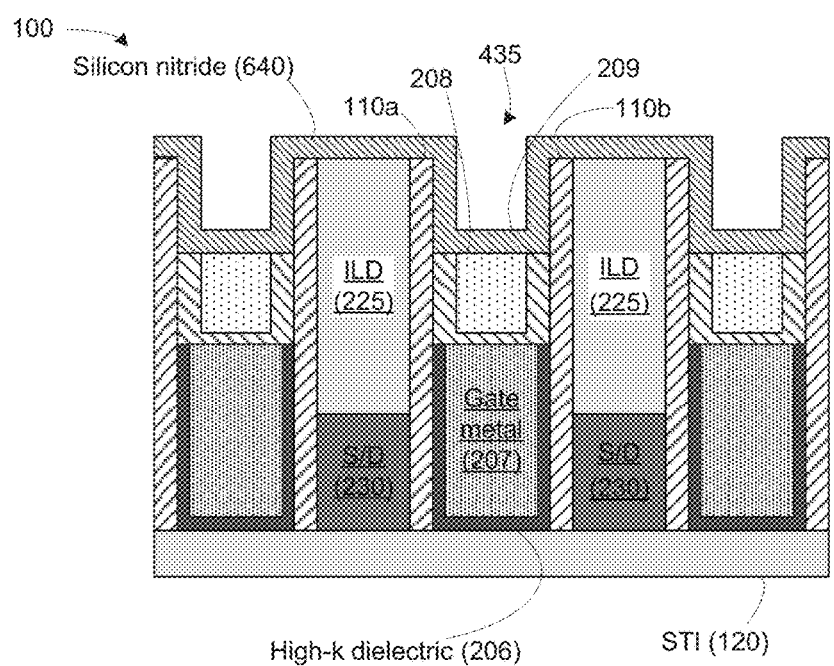
FIG. 7 illustrates a stylized depiction of an X2-cut cross-sectional view of the semiconductor device 100 of FIGS. 4-5 after the silicon nitride deposition process, in accordance with embodiments herein.

FIG. 6 illustrates a stylized depiction of an X1-cut cross-sectional view and FIG. 7 illustrates a stylized depiction of an X2-cut cross-sectional view of the semiconductor device 100 of FIGS. 4-5 after a silicon nitride deposition process, in accordance with embodiments herein. Silicon nitride 640 is conformally deposited, such as by atomic layer deposition (ALD), over the top of the semiconductor device 100. The silicon nitride 640 lines the bottom and sides of the recess 435 and the tops of the spacers 110 and the ILD 225.

Figure 8:
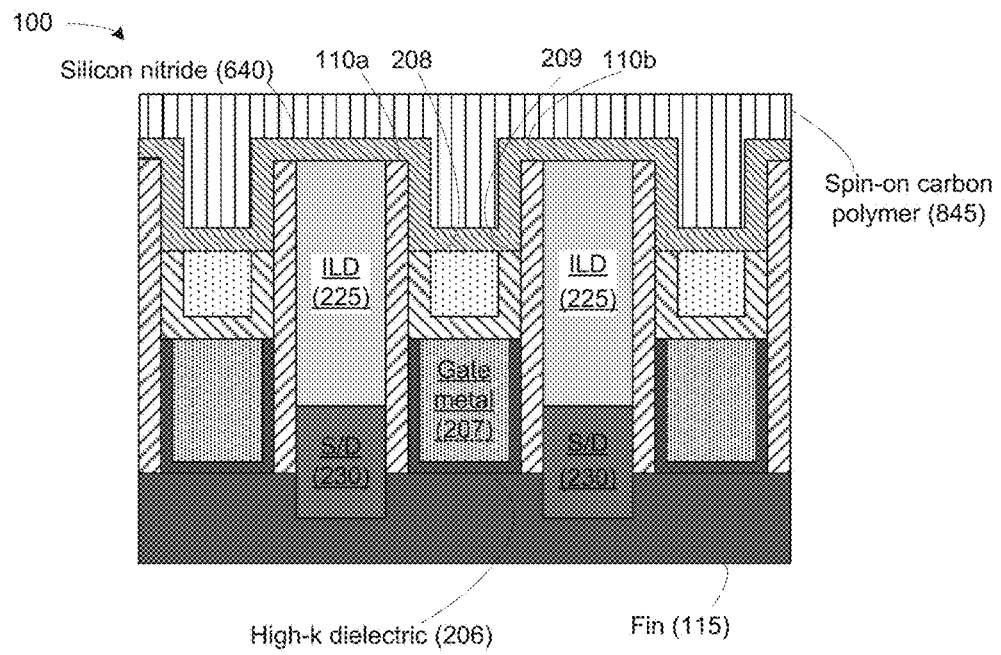
FIG. 8 illustrates a stylized depiction of an X1-cut cross-sectional view of the semiconductor device 100 of FIGS. 6-7 after a spin-on carbon polymer deposition process, in accordance with embodiments herein.
Figure 9:
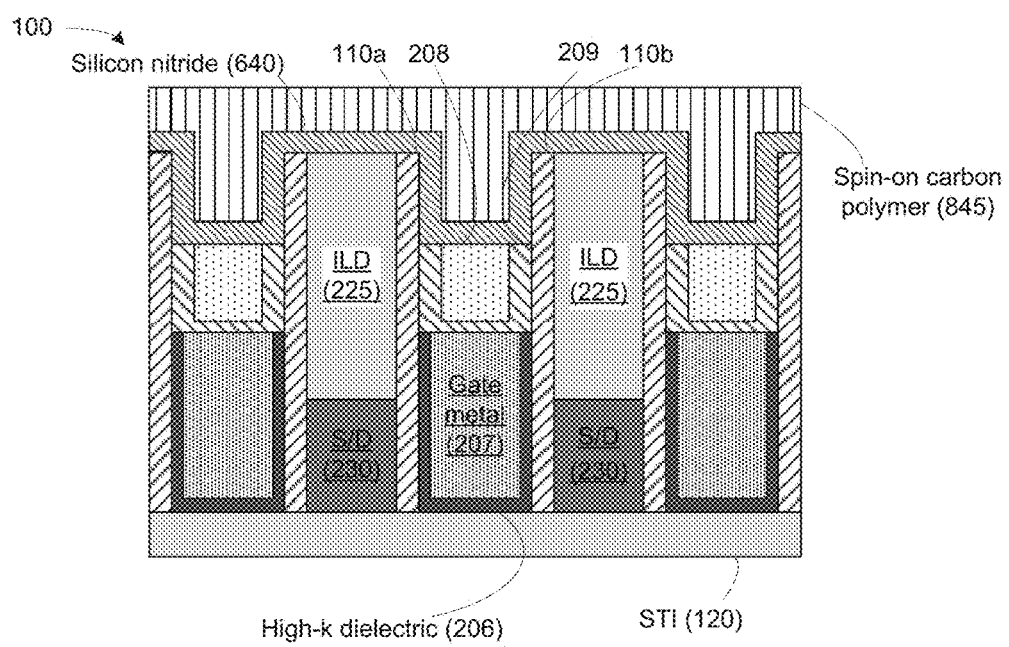
FIG. 9 illustrates a stylized depiction of an X2-cut cross-sectional view of the semiconductor device 100 of FIGS. 6-7 after the spin-on carbon polymer deposition process, in accordance with embodiments herein.

FIG. 8 illustrates a stylized depiction of an X1-cut cross-sectional view and FIG. 9 illustrates a stylized depiction of an X2-cut cross-sectional view of the semiconductor device 100 of FIGS. 6-7 after a spin-on carbon polymer deposition process, in accordance with embodiments herein. A spin-on carbon polymer 845 is deposited over the semiconductor device 100, overfilling the recess 435 and surmounting the spacers 110 and the ILD 225.

Figure 10:
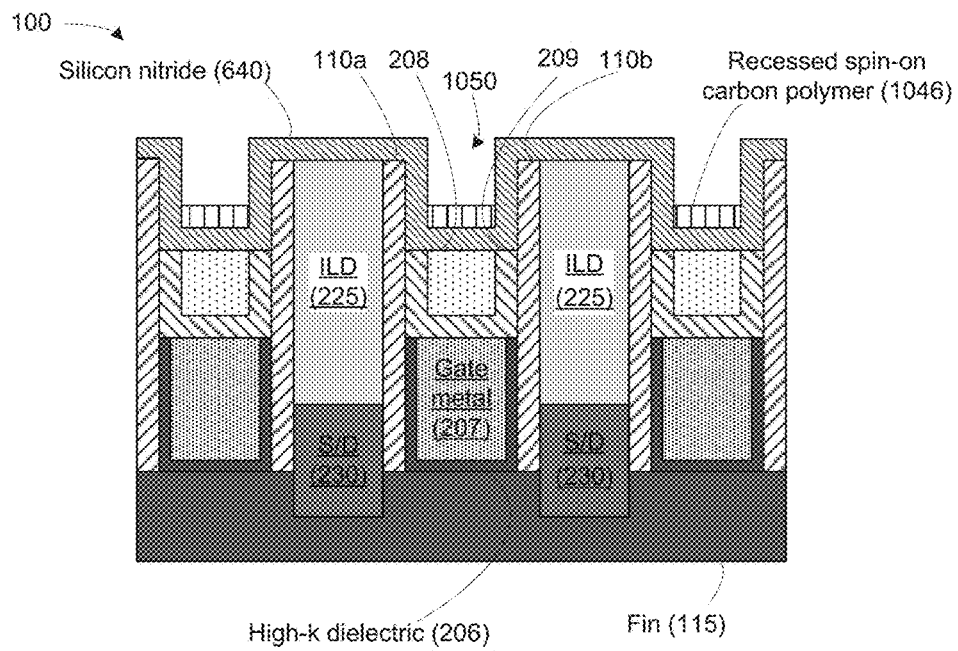
FIG. 10 illustrates a stylized depiction of an X1-cut cross-sectional view of the semiconductor device 100 of FIGS. 8-9 after a spin-on carbon polymer recession process, in accordance with embodiments herein.
Figure 11:
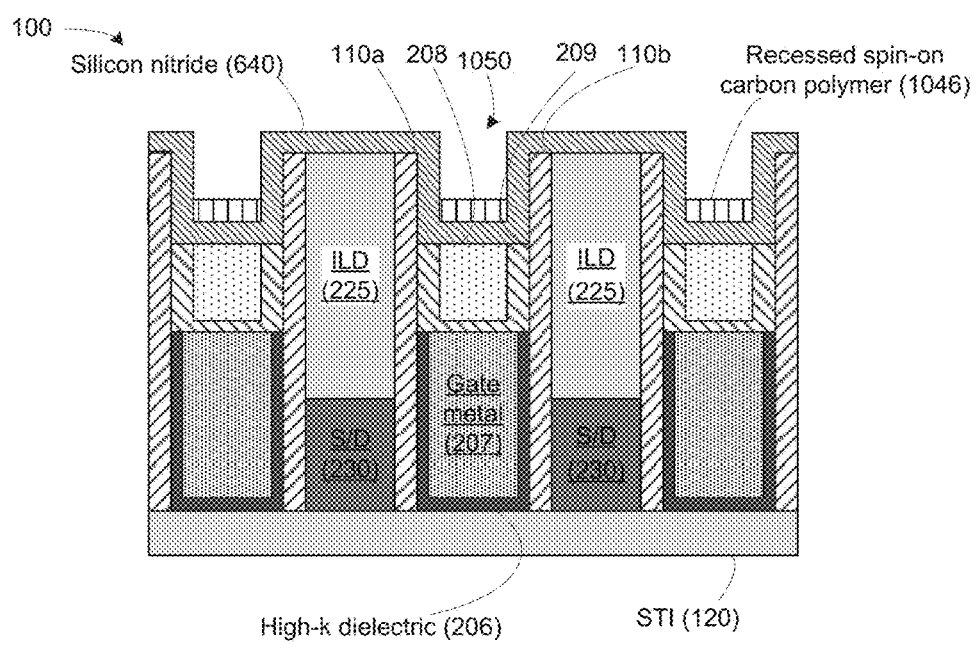
FIG. 11 illustrates a stylized depiction of an X2-cut cross-sectional view of the semiconductor device 100 of FIGS. 8-9 after the spin-on carbon polymer recession process, in accordance with embodiments herein.

FIG. 10 illustrates a stylized depiction of an X1-cut cross-sectional view and FIG. 11 illustrates a stylized depiction of an X2-cut cross-sectional view of the semiconductor device 100 of FIGS. 8-9 after a spin-on carbon polymer recession process, in accordance with embodiments herein. The spin-on carbon polymer 845 is recessed to below the top of the first spacer 110a and the second spacer 110b, thereby yielding a recessed spin-on carbon polymer 1046 and a recess 1050. The sides of the recess 1050 are lined with the silicon nitride 640.

Figure 12:
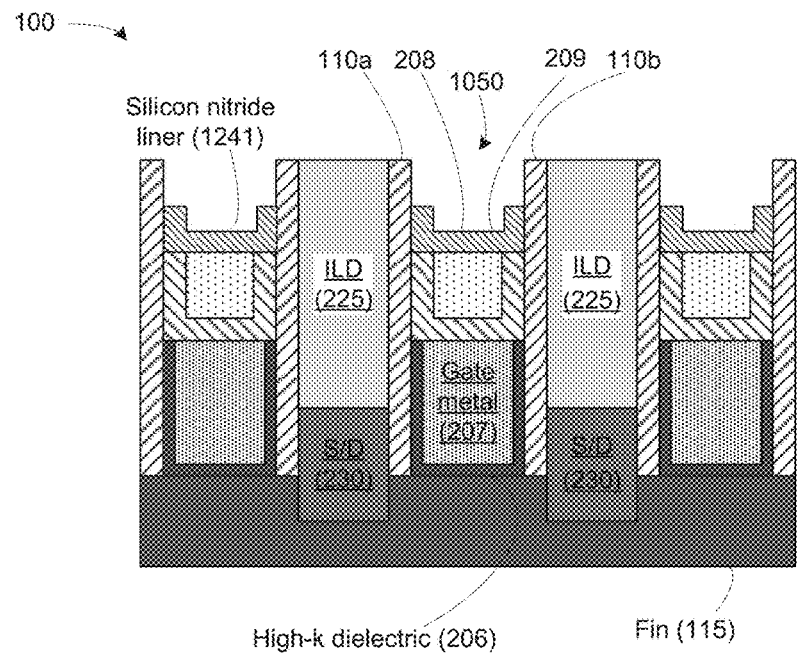
FIG. 12 illustrates a stylized depiction of an X1-cut cross-sectional view of the semiconductor device 100 of FIGS. 10-11 after a silicon nitride recession and a spin-on carbon polymer removal process, in accordance with embodiments herein.
Figure 13:
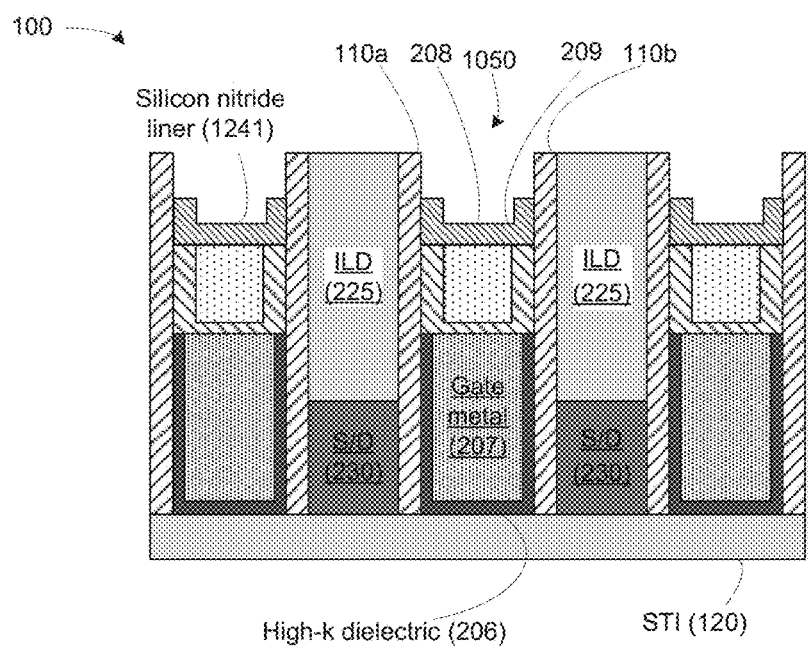
FIG. 13 illustrates a stylized depiction of an X2-cut cross-sectional view of the semiconductor device 100 of FIGS. 10-11 after the silicon nitride recession and a spin-on carbon polymer removal process, in accordance with embodiments herein.

FIG. 12 illustrates a stylized depiction of an X1-cut cross-sectional view and FIG. 13 illustrates a stylized depiction of an X2-cut cross-sectional view of the semiconductor device 100 of FIGS. 10-11 after a silicon nitride recession and a spin-on carbon polymer removal process, in accordance with embodiments herein. In the silicon nitride recession process, the silicon nitride 640 is recessed to the top of the recessed spin-on carbon polymer 1046 of FIGS. 10-11. The recessed spin-on carbon polymer 1046 is then removed. As a result, the recess 1050 is deepened and widened relative to its depth and width in FIGS. 10-11. The spacers 110 now provide upper portions of the sidewalls of the recess 1050. The bottom and the lower portions of the sidewalls of the recess 1050 are provided by silicon nitride liner 1241.

Figure 14:
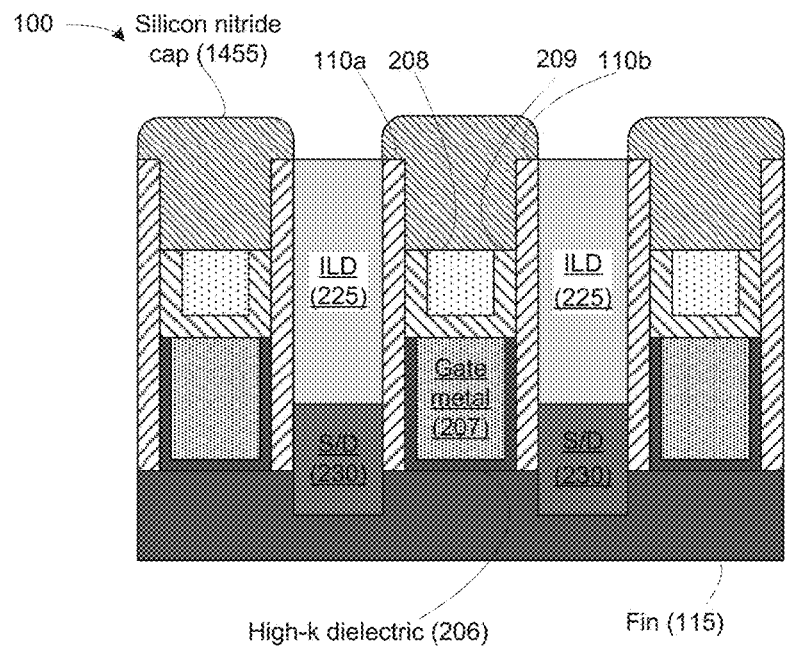
FIG. 14 illustrates a stylized depiction of an X1-cut cross-sectional view of the semiconductor device 100 of FIGS. 12-13 after a cap formation process, in accordance with embodiments herein.
Figure 15:
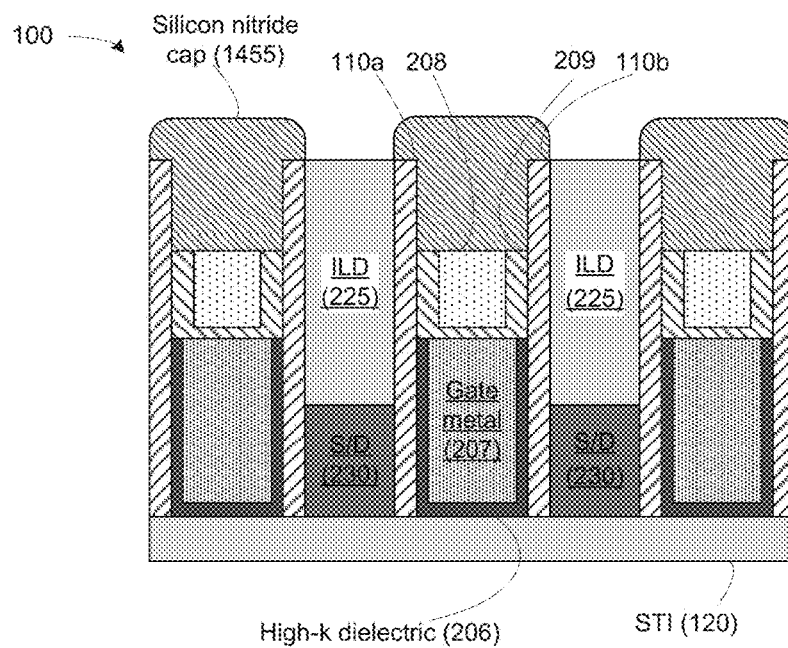
FIG. 15 illustrates a stylized depiction of an X2-cut cross-sectional view of the semiconductor device 100 of FIGS. 12-13 after the cap formation process, in accordance with embodiments herein.

FIG. 14 illustrates a stylized depiction of an X1-cut cross-sectional view and FIG. 15 illustrates a stylized depiction of an X2-cut cross-sectional view of the semiconductor device 100 of FIGS. 12-13 after a cap formation process, in accordance with embodiments herein. In the cap formation process, a silicon nitride cap 1455 is grown selectively on the silicon nitride liner 1241. The silicon nitride liner 1241 is effectively subsumed into the silicon nitride cap 1455, and accordingly, the silicon nitride liner 1241 is not separately identified in FIGS. 14-23. The selective growth of the silicon nitride cap 1455 enables most, if not all, of the growth of the silicon nitride cap 1455 to fill the recess 1050 shown in FIGS. 12-13 and grow onto the top of the first spacer 110*a* and the second spacer 110*b*, with little or no growth of the silicon nitride cap 1455 over the ILD 225.

To effect selective growth of the silicon nitride cap 1455 on the silicon nitride liner 1241, the silicon nitride liner 1241 may be precleaned with diluted hydrofluoric acid (DHF) and the silicon nitride cap 1455 may be grown by silicon nitride deposition at a temperature of at least about 500° C. In some embodiments, the silicon nitride cap 1455 may be grown by silicon nitride deposition at a temperature in the range of about 200° C. to about 600° C. The presence of the ILD 225 over the sources/drains 230 is expected to protect the sources/drains 230 from damage during the silicon nitride cap 1455 formation process.

Figure 16:
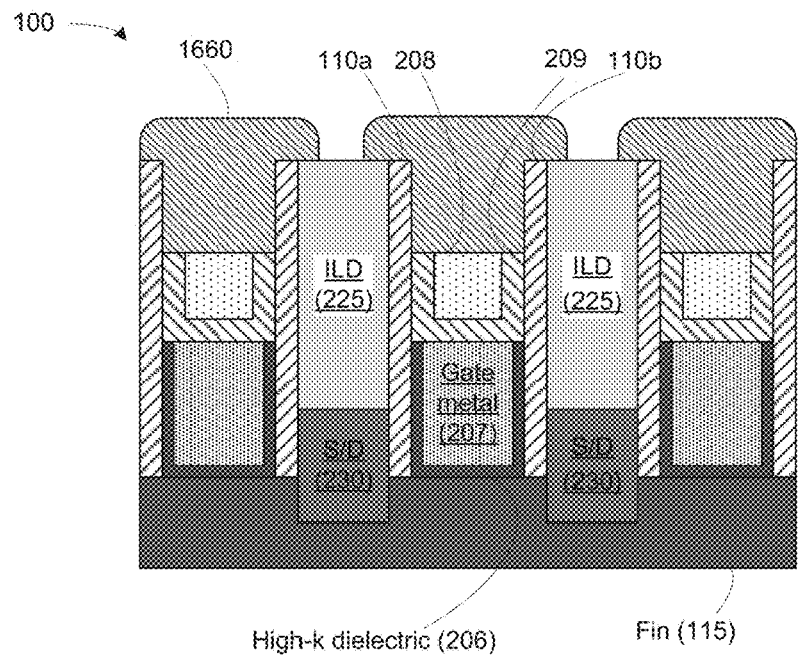
FIG. 16 illustrates a stylized depiction of an X1-cut cross-sectional view of the semiconductor device 100 of FIGS. 14-15 after an alternative cap formation process, in accordance with embodiments herein.
Figure 17:
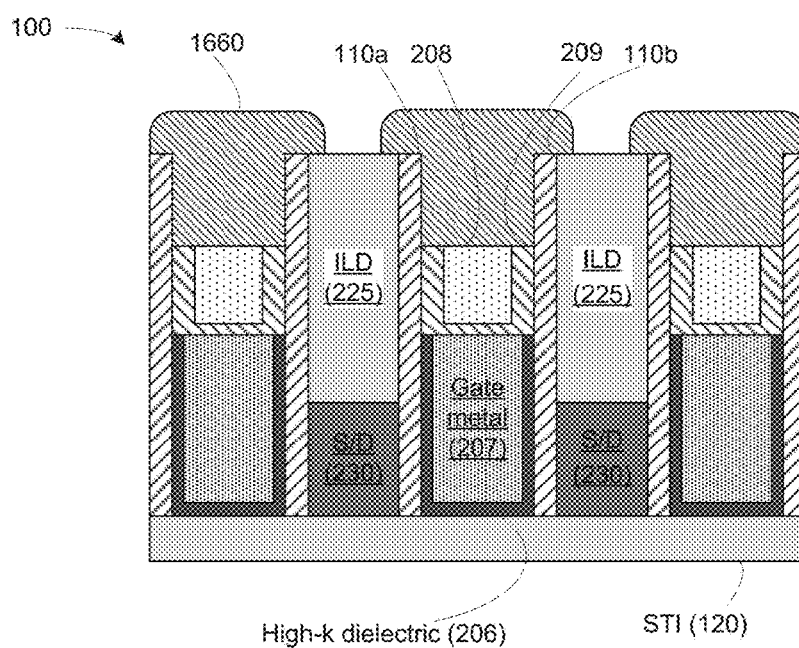
FIG. 17 illustrates a stylized depiction of an X2-cut cross-sectional view of the semiconductor device 100 of FIGS. 14-15 after the alternative cap formation process, in accordance with embodiments herein.

FIG. 16 illustrates a stylized depiction of an X1-cut cross-sectional view and FIG. 17 illustrates a stylized depiction of an X2-cut cross-sectional view of the semiconductor device 100 of FIGS. 14-15 after an alternative cap formation process, in accordance with embodiments herein. In this alternative process, parameters are adjusted to encourage growth of a silicon nitride cap 1660 partially over the top of the ILD 225. In some embodiments, the growth time may be increased for forming a wider SiN cap. Though not to be bound by theory, the presence of the silicon nitride cap 1660 partially over the top of the ILD 225 may allow improved protection of the spacers 110 during later processing, relative to the silicon nitride cap 1455 shown in FIGS. 15-16.

Figure 18:
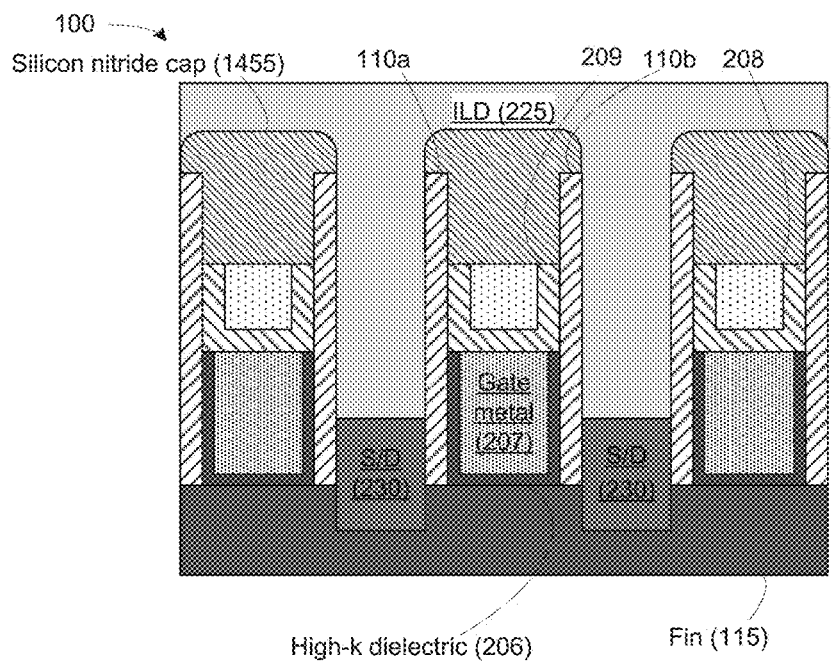
FIG. 18 illustrates a stylized depiction of an X1-cut cross-sectional view of the semiconductor device 100 of FIGS. 14-15 after a dielectric addition process, in accordance with embodiments herein.
Figure 19:
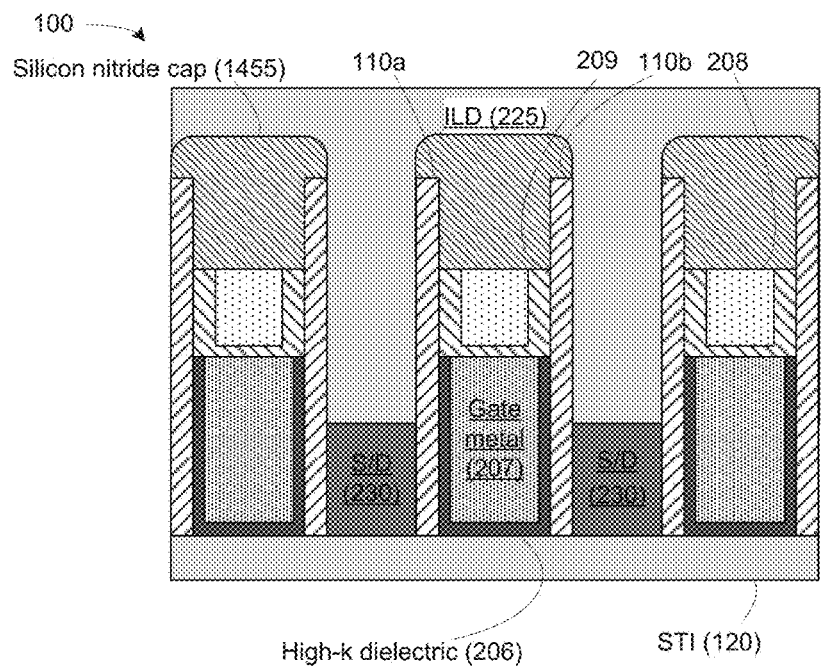
FIG. 19 illustrates a stylized depiction of an X2-cut cross-sectional view of the semiconductor device 100 of FIGS. 14-15 after the dielectric addition process, in accordance with embodiments herein.

FIG. 18 illustrates a stylized depiction of an X1-cut cross-sectional view and FIG. 19 illustrates a stylized depiction of an X2-cut cross-sectional view of the semiconductor device 100 of FIGS. 14-15 after a dielectric addition process, in accordance with embodiments herein. A dielectric material, which may but need not be the same material as the ILD 225, is formed on the semiconductor device 100. Doing so effectively increases the height of the ILD 225 to above the top of the silicon nitride cap 1455 (or the top of the silicon nitride cap 1660, if the dielectric addition process were performed on the semiconductor device 100 of FIGS. 16-17 (not shown.))

Figure 20:
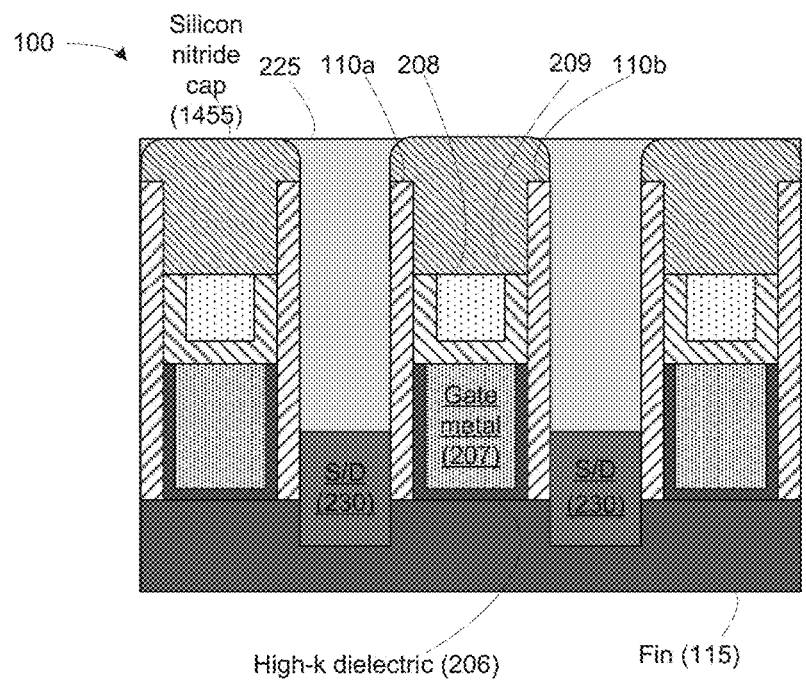
FIG. 20 illustrates a stylized depiction of an X1-cut cross-sectional view of the semiconductor device 100 of FIGS. 18-19 after a dielectric planarization process, in accordance with embodiments herein.
Figure 21:
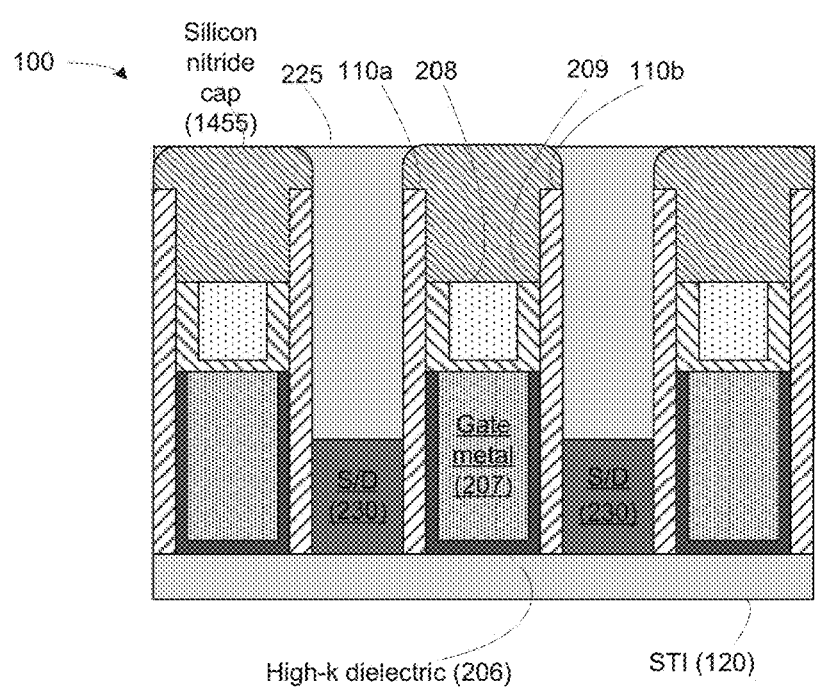
FIG. 21 illustrates a stylized depiction of an X2-cut cross-sectional view of the semiconductor device 100 of FIGS. 18-19 after the dielectric planarization process, in accordance with embodiments herein.

FIG. 20 illustrates a stylized depiction of an X1-cut cross-sectional view and FIG. 21 illustrates a stylized depiction of an X2-cut cross-sectional view of the semiconductor device 100 of FIGS. 18-19 after a dielectric planarization process, in accordance with embodiments herein. Planarization of the ILD 225 to be coplanar with the top of the silicon nitride cap 1455 may involve chemical mechanical polishing (CMP).

Figure 22:
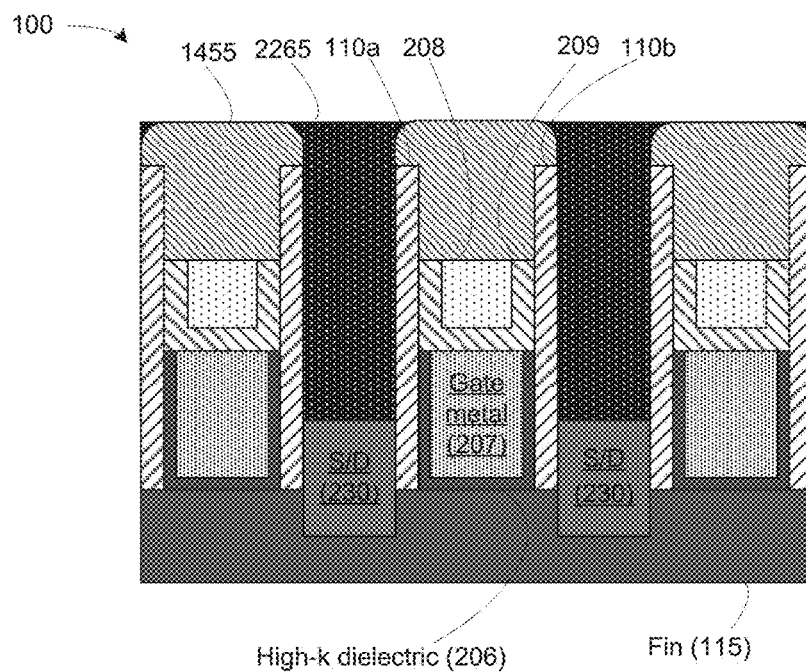
FIG. 22 illustrates a stylized depiction of an X1-cut cross-sectional view of the semiconductor device 100 of FIGS. 20-21 after a contact formation process, in accordance with embodiments herein.
Figure 23:
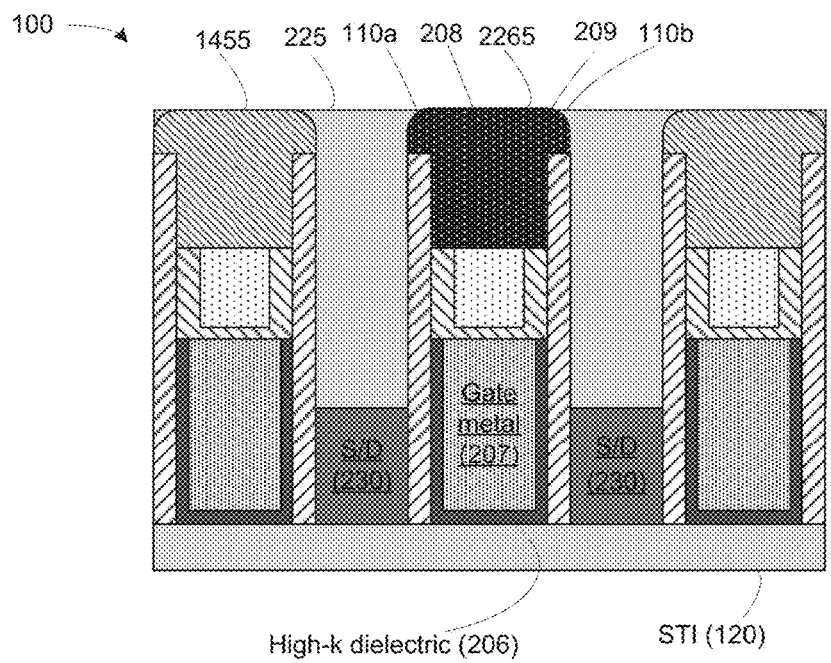
FIG. 23 illustrates a stylized depiction of an X2-cut cross-sectional view of the semiconductor device 100 of FIGS. 20-21 after the contact formation process, in accordance with embodiments herein.

FIG. 22 illustrates a stylized depiction of an X1-cut cross-sectional view and FIG. 23 illustrates a stylized depiction of an X2-cut cross-sectional view of the semiconductor device 100 of FIGS. 20-21 after a contact formation process, in accordance with embodiments herein. In this process, at least a portion of ILD 225 is removed over the fin 155 to expose at least a portion of each source/drain 230 (FIG. 22) and at least a portion of the gate 105 is removed over the STI 120 to expose at least a portion of the low resistance metal 208 and the nitride liner 209 (FIG. 23). Subsequently, contacts 2265 are formed to contact the source/drains 230 (FIG. 22) and the low resistance metal 208 (FIG. 23) in the spaces where the ILD 225 and the gate 105 were removed. The contact formation process depicted in FIGS. 22-23 may be considered a self-aligned contact formation process.

After the contact formation depicted in FIGS. 21-22, further processing events may be performed to prepare the semiconductor device 100 for an intended use. For example, metallization layers and other structures may be formed above the semiconductor device 100 shown in FIGS. 21-22. Such additional steps may be routinely implemented by the person of ordinary skill in the art having the benefit of the present disclosure.

Figure 24:
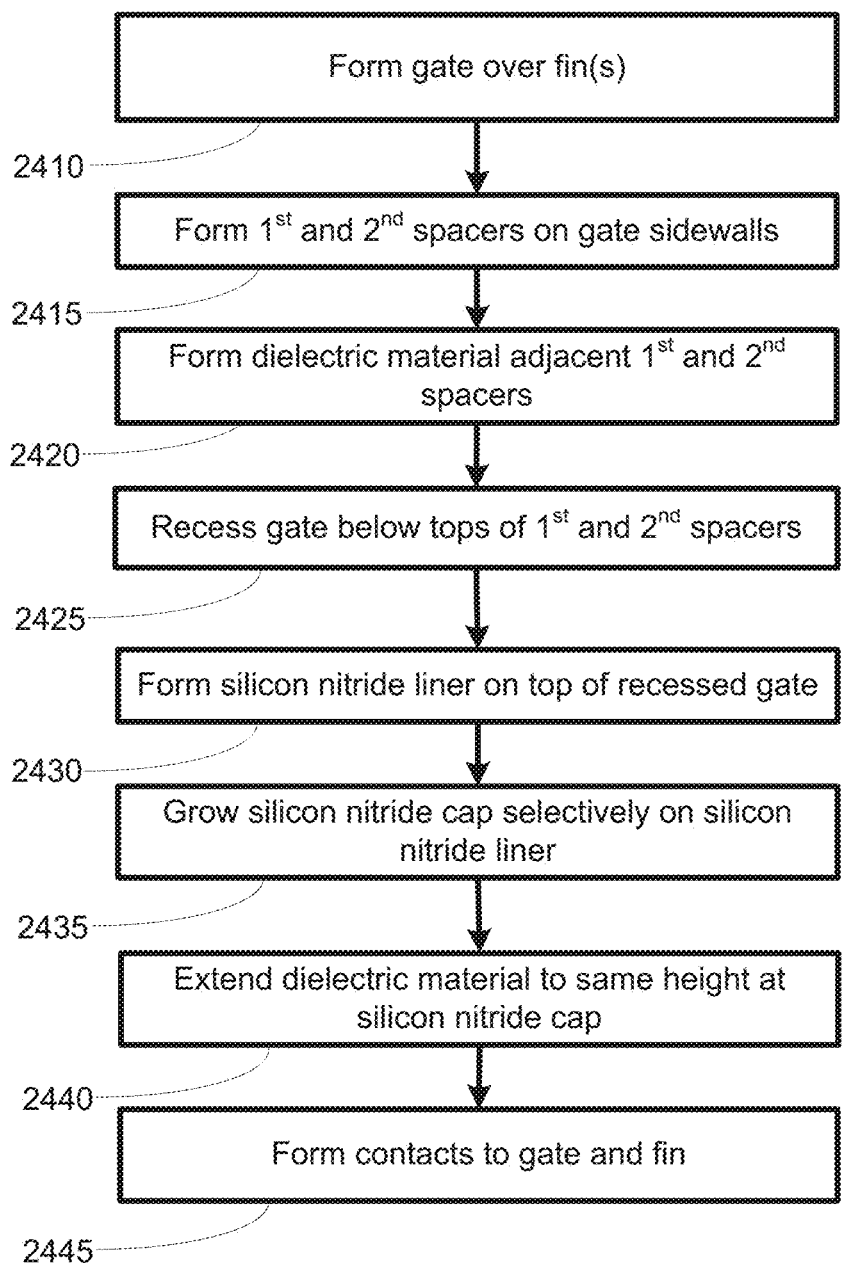
FIG. 24 illustrates a flowchart depiction of a method for manufacturing a device, in accordance with embodiments herein.

FIG. 24 illustrates a flowchart depiction of a method 2400 for manufacturing a device, in accordance with embodiments herein. The method 2400 comprises forming (at 2410) a gate over at least one fin disposed on a semiconductor substrate. The method 2400 additionally comprises forming (at 2415) a first spacer disposed on one gate sidewall and a second spacer disposed on another gate sidewall. The method 2400 further comprises forming (at 2420) a dielectric material adjacent the first spacer and adjacent the second spacer.

The method 2400 also comprises recessing (at 2425) the gate to below a top of the first spacer and a top of the second spacer. The method 2400 additionally comprises forming (at 2430) a silicon nitride liner on a top of the recessed gate.

In one embodiment, the forming (at 2430) the silicon nitride liner may comprise depositing by atomic layer deposition (ALD) of silicon nitride on a top of the recessed gate, on an exposed sidewall portion and a top of the first spacer, on an exposed sidewall portion and a top of the second spacer, and on a top of the dielectric material; coating the silicon nitride with a spin-on carbon polymer; recessing the spin-on carbon polymer to below the top of the first spacer and the top of the second spacer, to yield recessed spin-on carbon polymer; removing the silicon nitride above the recessed spin-on carbon polymer, to yield the silicon nitride liner; and removing the recessed spin-on carbon polymer.

The method 2400 yet also comprises growing (at 2435) a silicon nitride cap selectively on the silicon nitride liner and at least on a top of the first spacer and a top of the second spacer.

In one embodiment, the growing (at 2435) the silicon nitride cap may comprise treating the dielectric material to prevent silicon nitride growth on the dielectric material. Alternatively or in addition, the growing (at 2435) the silicon nitride cap may further comprise growth of silicon nitride over a portion of the dielectric material.

The method 2400 additionally further comprises extending (at 2440) the dielectric material to the same height as the silicon nitride cap.

In one embodiment, the extending (at 2440) the dielectric material to the same height as the silicon nitride cap may comprise overfilling a gap adjacent to the silicon nitride cap with the dielectric material and performing chemical mechanical polishing (CMP) to planarize the dielectric material to a top of the silicon nitride cap.

Finally, the method 2400 yet additionally comprises forming (at 2445) contacts to the gate and the fin, wherein contact formation is self-aligned by the silicon nitride cap.

In one embodiment, the forming (at 2445) the contacts to the gate and to the fin comprises forming the contact to the gate at a position disposed laterally away from the fin. For example, the contact to the gate may be formed over an STI disposed laterally away from the fin.

In one embodiment, in the forming (at 2420) and the extending (at 2440) the dielectric material, the dielectric material may be silicon oxide.

Figure 25:
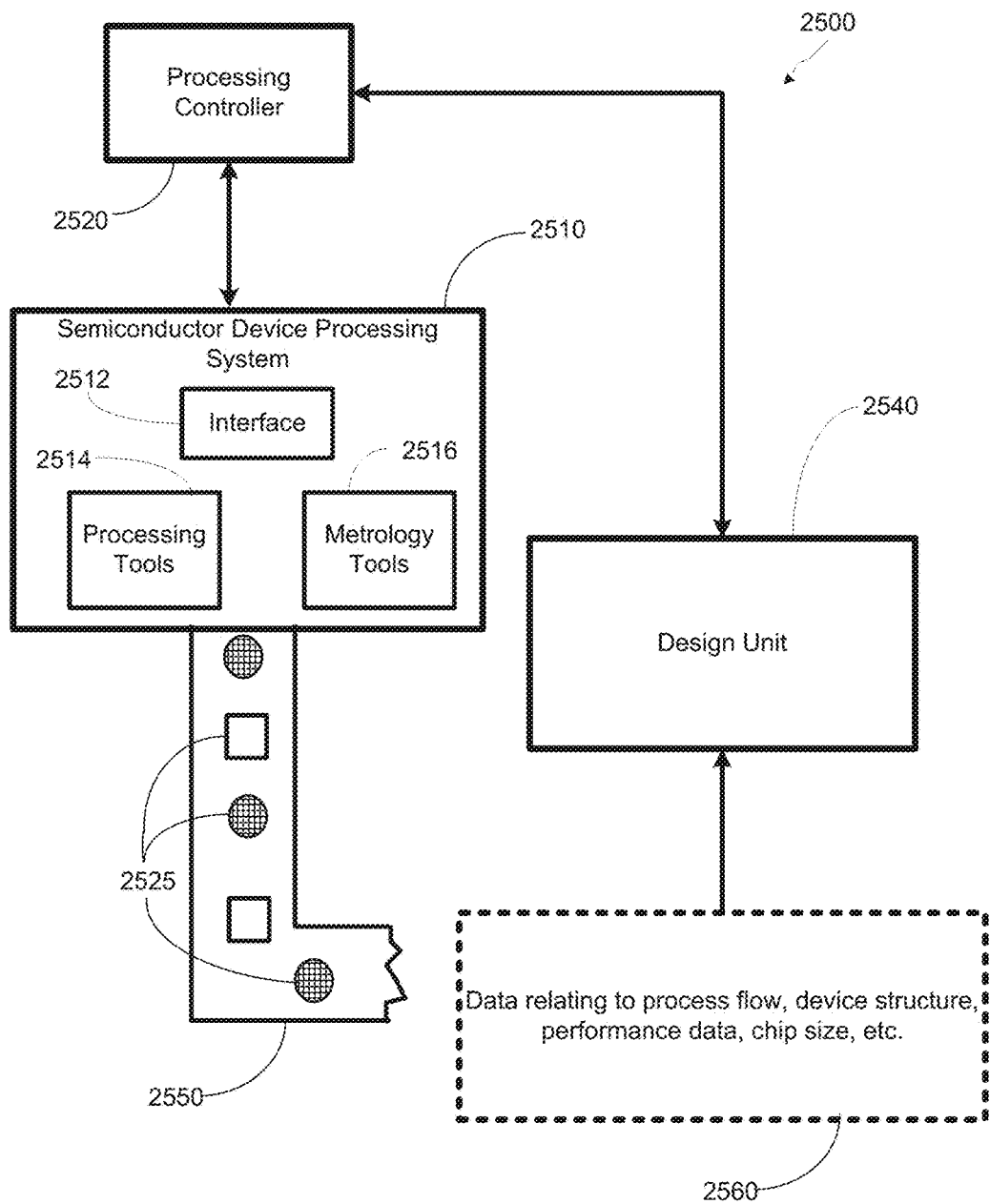
FIG. 25 illustrates a stylized depiction of a system for fabricating a semiconductor device 100 comprising an integrated circuit, in accordance with embodiments herein.

Turning now to FIG. 25, a stylized depiction of a system for fabricating a semiconductor device, in accordance with embodiments herein, is illustrated. The system 2500 provides for semiconductor devices comprising a silicon nitride cap enabling a self-aligned contact formation process.

The system 2500 of FIG. 25 may comprise a semiconductor device processing system 2510 and a design unit 2540. The semiconductor device processing system 2510 may manufacture integrated circuit devices based upon one or more designs provided by the design unit 2540.

The semiconductor device processing system 2510 may comprise various processing tools 2514, such as etch process stations, photolithography process stations, oxide deposition process stations, CMP process stations, Epitaxy (EPI) process stations, etc. The semiconductor device processing system 2510 may also comprise one or more metrology tools 2516. One or more of the processing steps performed by the processing system 2510 may be controlled by the processing controller 2520. The processing controller 2520 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc. Generally, the processing controller 2520 may communicate to the semiconductor device processing system 2510 via an interface 2512.

The semiconductor device processing system 2510 may produce semiconductor devices on a medium, such as silicon wafers. More particularly, the semiconductor device processing system 2510 may produce semiconductor devices as described above.

The production of integrated circuits by the device processing system 2510 may be based upon the circuit designs provided by the integrated circuits design unit 2540. The processing system 2510 may provide processed integrated circuits/devices 2525 on a transport mechanism 2550, such as a conveyor system. In some embodiments, the conveyor system may be sophisticated clean room transport systems that are capable of transporting semiconductor wafers.

In some embodiments, the items labeled "2525" may represent individual wafers, and in other embodiments, the items 2525 may represent a group of semiconductor wafers, e.g., a "lot" of semiconductor wafers. The semiconductor device 2525 may be a transistor, a capacitor, a resistor, a memory cell, a processor, and/or the like.

The design unit 2540 of the system 2500 is capable of providing a circuit design that may be manufactured by the semiconductor processing system 2510. The design unit 2540 may be capable of determining the number of devices (e.g., processors, memory devices, etc.) to place in a device package, silicon nitride liner formation specifications, silicon nitride liner treatment specifications, silicon nitride cap formation specifications, and other process specifications. Based at least upon these specifications, the design unit 2540 may provide data for manufacturing a semiconductor device in accordance with embodiments herein.

The system 2500 may be capable of performing analysis and manufacturing of various products involving various technologies. For example, the system 2500 may design and manufacturing-data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a gate over at least one active area disposed on a semiconductor substrate;
    forming a first spacer disposed on one gate sidewall and a second spacer disposed on another gate sidewall;
    forming a dielectric material adjacent the first spacer and adjacent the second spacer;
    recessing the gate to below a top of the first spacer and a top of the second spacer;
    forming a silicon nitride liner on a top of the recessed gate;
    growing a silicon nitride cap selectively on the silicon nitride liner and at least on a top of the first spacer and a top of the second spacer; and
    forming contacts to the gate and the active area, wherein contact formation is self-aligned by the silicon nitride cap.

2. The method of claim 1, wherein the forming the silicon nitride liner comprises:
    depositing by atomic layer deposition (ALD) of silicon nitride on a top of the recessed gate, on an exposed sidewall portion and a top of the first spacer, on an exposed sidewall portion and a top of the second spacer, and on a top of the dielectric material;
    coating the silicon nitride with a spin-on carbon polymer;
    recessing the spin-on carbon polymer to below the top of the first spacer and the top of the second spacer, to yield recessed spin-on carbon polymer;
    removing the silicon nitride above the recessed spin-on carbon polymer, to yield the silicon nitride liner; and
    removing the recessed spin-on carbon polymer.

3. The method of claim 1, wherein growing the silicon nitride cap comprises treating the dielectric material to prevent silicon nitride growth on the dielectric material.

4. The method of claim 1, wherein the growing the silicon nitride cap further comprises growth of silicon nitride over a portion of the dielectric material.

5. The method of claim 1, further comprising extending the dielectric material to the same height as the silicon nitride cap prior to the forming the contacts to the gate and the active area.

6. The method of claim 1, wherein the forming the contacts to the gate and to the active area comprises forming the contact to the gate at a position disposed laterally away from the active area.

7. The method of claim 1, wherein in the forming the dielectric material, the dielectric material is silicon oxide.

8. A system, comprising:
    a semiconductor device processing system to manufacture a semiconductor device; and
    a processing controller operatively coupled to the semiconductor device processing system, the processing controller configured to control an operation of the semiconductor device processing system;

wherein the semiconductor device processing system is adapted to:
  form a gate over at least one active area disposed on a semiconductor substrate;
  form a first spacer disposed on one gate sidewall and a second spacer disposed on another gate sidewall;
  form a dielectric material adjacent the first spacer and adjacent the second spacer;
  recess the gate to below a top of the first spacer and a top of the second spacer;
  form a silicon nitride liner on a top of the recessed gate;
  grow a silicon nitride cap selectively on the silicon nitride liner and at least on a top of the first spacer and a top of the second spacer; and <form contacts to the gate and the active area, wherein contact formation is self-aligned by the silicon nitride cap.

9. The system of claim 8, wherein the semiconductor device processing system is adapted to form the silicon nitride liner by:
  depositing by atomic layer deposition (ALD) silicon nitride on a top of the recessed gate, on an exposed sidewall portion and a top of the first spacer, on an exposed sidewall portion and a top of the second spacer, and on a top of the dielectric material;
  coating the silicon nitride with a spin-on carbon polymer;
  recessing the spin-on carbon polymer to below the top of the first spacer and the top of the second spacer, to yield recessed spin-on carbon polymer;
  removing the silicon nitride above the recessed spin-on carbon polymer, to yield the silicon nitride liner; and
  removing the recessed spin-on carbon polymer.

10. The system of claim 8, wherein the semiconductor device processing system is adapted to grow the silicon nitride cap by treating the dielectric material to prevent silicon nitride growth on the dielectric material.

11. The system of claim 8, wherein the semiconductor device processing system is adapted to further grow the silicon nitride cap over a portion of the dielectric material.

12. The system of claim 8, wherein the semiconductor device processing system is adapted to extend the dielectric material to the same height as the silicon nitride cap.

13. The system of claim 8, wherein the semiconductor device processing system is adapted to form the contact to the gate at a position disposed laterally away from the active area.

14. The system of claim 8, wherein the semiconductor device processing system is adapted to form silicon oxide as the dielectric material.

* * * * *